United States Patent [19]

Suzuki et al.

[11] Patent Number: 4,568,905
[45] Date of Patent: Feb. 4, 1986

[54] MAGNETOELECTRIC TRANSDUCER

[75] Inventors: Shinichi Suzuki, Yamanashi; Masanori Onuma, Saitama; Masami Mochizuki; Takashi Suemitsu, both of Yamanashi, all of Japan

[73] Assignee: Pioneer Electronic Corporation, Tokyo, Japan

[21] Appl. No.: 531,798

[22] Filed: Sep. 13, 1983

[30] Foreign Application Priority Data

Sep. 13, 1982 [JP] Japan .................................. 57-159190

[51] Int. Cl.$^4$ ............................................. H01L 43/00
[52] U.S. Cl. ................................ 338/32 H; 338/32 R; 204/192 S
[58] Field of Search ........................... 338/32 R, 32 H; 204/192 S

[56] References Cited

U.S. PATENT DOCUMENTS

| 3,373,391 | 4/1966 | Böhm et al. | 338/32 H |
| 3,852,103 | 12/1974 | Collins et al. | 338/32 R |
| 4,238,232 | 12/1980 | Minomura | 204/192 S |
| 4,398,342 | 8/1983 | Pitt et al. | 338/32 H |

FOREIGN PATENT DOCUMENTS

| 42165 | 12/1981 | European Pat. Off. | 338/32 H |
| 51-50684 | 10/1974 | Japan | 338/32 R |
| 52-37756 | 9/1977 | Japan | 338/42 |

OTHER PUBLICATIONS

Greene et al., "Epitaxial Growth of $In_{1-x}Ga_xSb$ Thin Films by Multitarget Rf Sputtering" Journal Vacuum Science Technology, vol. 14, No. 1, Jan./Feb. 1977, p. 114.

Primary Examiner—C. L. Albritton
Assistant Examiner—Marvin M. Lateef
Attorney, Agent, or Firm—Sughrue, Mion, Zinn, Macpeak, and Seas

[57] ABSTRACT

A magnetoelectric transducer having a substrate of magnetic or non-magnetic material is improved by providing a thin film of crystalline semiconductor $In_{1-x}Ga_xSb$ ($0 < x \leq 0.2$) on the substrate either directly or through a metal or semiconductor oxide film.

10 Claims, 6 Drawing Figures

MAGNETOELECTRIC TRANSDUCER

BACKGROUND OF THE INVENTION

The present invention relates to a magnetoelectric transducer such as a Hall device or magnetoresistor, and more particularly to a magnetoelectric transducer using a thin film of semiconductor crystal.

Conventional magnetoelectric transducers use thin semiconductor films of InSb (indium-antimony), InAs (Indium-arsenic) and GaAs (gallium-arsenic), which are produced by vacuum vapor deposition and CVD techniques.

FIG. 1 shows a cross section of a Hall device having a thin semiconductor film formed on a ceramic substrate by vacuum vapor deposition. In FIG. 1, numeral 1 indicates the ceramic substrate, and 2 is a thin film of crystalline InSb grown by vacuum vapor deposition. An aluminum electrode layer 3 is formed on the substrate and part of the semiconductor film by vapor deposition. An aluminum oxide ($Al_2O_3$) protective film 4 is formed on the bare part of the semiconductor film not covered by the electrode layer. The protective film extends to cover part of the electrode layer. The entire assembly is packaged within a molding resin 5 to provide a Hall device as shown in FIG. 1.

FIG. 2 is a cross section of a Hall device using a ferrite substrate 1. An aluminum oxide ($Al_2O_3$) film 6 is deposited on the entire surface of the substrate, and a thin film of crystalline InSb 2 is formed on part of the oxide film by vacuum vapor deposition. Subsequently, as in the fabrication of the Hall device of FIG. 1, an aluminum electrode layer 3 and an $Al_2O_3$ protective film 4 are successively formed. A collector 7 is fixed to a generally central part of the protective film on the thin semiconductor film not covered by the electrode layer. Thereafter, the entire assembly is packaged within a molding resin 5.

In the fabrication of the Hall device of FIG. 1, the surface of the partially grown crystal of InSb is mirror-polished before further growth of the crystalline semiconductor film is performed by CVD or vacuum vapor deposition techniques. Thereafter, a magnetic sensitive pattern is formed either by photoetching or mask vapor deposition effected simultaneously with the epitaxial growth. The pattern for the Al electrode layer 3 and $Al_2O_3$ protective film 4 is also formed by photoetching or mask vapor depositions. After forming the respective layers, the devices on the substrate are cut apart and subjected to the final assembly process.

The device of FIG. 2 using a ferrite substrate can be fabricated by substantially the same method used for producing the device of FIG. 1, except that the $Al_2O_3$ film 6 is formed on the ferrite substrate to promote crystal growth of the thin semiconductor film 2, and the collector 7 is fixed to the semiconductor film through the $Al_2O_3$ protective film 4 so as to provide higher sensitivity.

The thin semiconductor film used as a magnetoelectric transducer is required to have a high mobility and Hall constant. With a Hall device, high product sensitivity requires a high Hall constant, and if both the Hall constant and the mobility are high, the sensitivity at maximum magnetic flux density, the Hall output and the magnetoelectric conversion efficiency increase. With a magnetoresistor, high mobilities are required to attain a great change in resistance, and if the Hall constant is also high, higher square-sensitivity and linear sensitivity can be attained.

The thin semiconductor films used as magnetoelectric transducers are commonly made of InSb and GaAs. An InSb film 1.4$\mu$ thick formed on a silicon substrate has a Hall constant of 200–250 $cm^3$/coulomb and a mobility of about 20,000 $cm^2$/V. sec. The mobility is very great but the Hall constant is low. Under the same conditions, a GaAs film has a Hall constant of 3,000 $cm^3$/coulomb and a mobility of about 4,000 $cm^2$/V. sec. The Hall constant is great but the mobility is small. Therefore, neither semiconductor has been able to provide a device that satisfies all the necessary characteristics.

SUMMARY OF THE INVENTION

The present invention solves this problem by replacing the conventional thin InSb or GaAs film with a thin film of crystalline $In_{1-x}Ga_xSb$ ($0<x<0.4$), and by optionally forming this thin film in a recess made in a generally central part of an oxide (e.g. $Al_2O_3$) film. A magnetoelectric transducer using this thin film has not only a high mobility and Hall constant, but also exhibits significantly improved product sensitivity and sensitivity at maximum flux density.

DETAILED DESCRIPTION OF THE PREFERRED EMBODIMENTS

Figure 3:
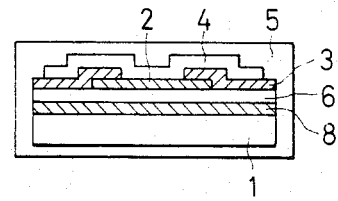
FIG. 3 shows an embodiment of the magnetoelectric transducer according to the present invention.

The present invention is hereunder described more specifically with reference to FIGS. 3 to 6. An embodiment of the magnetoelectric transducer of the present invention is shown in FIG. 3, wherein the entire surface of a silicon substrate 1 is covered with a $SiO_2$ semiconductor oxide film 8 by sputtering, thermal oxidation or CVD techniques. On this semiconductor film 8, a metal oxide ($Al_2O_3$) film 6 is deposited by RF sputtering or CVD techniques. On the surface of this metal oxide film 6, a thin film 2 of crystalline $In_{1-x}Ga_xSb$ ($0<x<0.4$) is formed by vapor deposition or CVD techniques.

An aluminum electrode layer 3 is formed on the $Al_2O_3$ film 6 and part of the thin semiconductor film 2 by vapor deposition. An $Al_2O_3$ protective film 4 is deposited on the bare part of the thin semiconductor film 2 not covered by the electrode layer 3. The entire assembly is then packaged within a molding resin 5.

The variable x in the formula $In_{1-x}Ga_xSb$ (indium-gallium-antimony) represents the mol percentage of GaSb. If x=0.2, GaSb=20 mol %. For a given change in x, the Hall constant and mobility change in opposite directions. If x increases, the Hall constant increases but the mobility decreases, and if x decreases, the Hall constant decreases and the mobility increases.

The upper limit of x suitable for use as a magnetoelectric transducer is 0.4 (GaSb=40 mol %). For use as a Hall device, $0<x\leq 0.2$ is preferred. The following table shows Hall constant and mobility data as against x for a Hall device of the type shown in FIG. 3 which is characterized by: a silicon substrate 1 with a thickness of 400μ, a SiO$_2$ film 8 with a thickness of 6,000 Å, an Al$_2$O$_3$ film 6 with a thickness of 3,000 Å, an In$_{1-x}$Ga$_x$Sb film 2 with a thickness of 1.4μ, and an Al$_2$O$_3$ protective film 5 with a thickness of 3,000 Å.

| x (mol % of GaSb) | Hall constant (cm$^3$/coul.) | Mobility (cm$^2$/V. sec.) |
|---|---|---|
| 0.15 | 565 | 16,000 |
| 0.19 | 700 | 10,000 |

Figure 1:
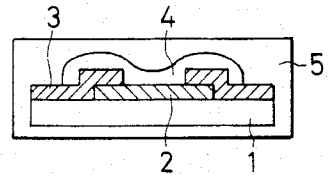
FIGS. 1 and 2 show two conventional magnetoelectric transducers (Hall devices)
Figure 2:
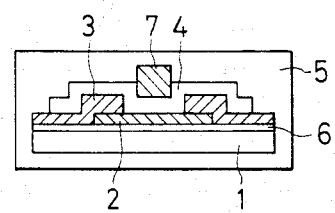

In the device of FIG. 3, the SiO$_2$ film 8 is formed on the Si substrate 1 so as to form an In$_{1-x}$Ga$_x$Sb film 2 of uniform composition on the Al$_2$O$_3$ film 6. The Al$_2$O$_3$ film 6, which is provided to form an In$_{1-x}$Ga$_x$Sb film 2 of good quality, may be formed on the Si substrate 1 directly as a relatively thick layer. Alternatively, the In$_{1-x}$Ga$_x$Sb film may be formed on a ceramic substrate (as shown in FIG. 1) either directly or through the Al$_2$O$_3$ film, or the semiconductor film may be formed on an Al$_2$O$_3$ film on a ferrite substrate as shown in FIG. 2. As another modification of the device of FIG. 3, a collector may be fixed onto the protective film 4.

Figure 4:
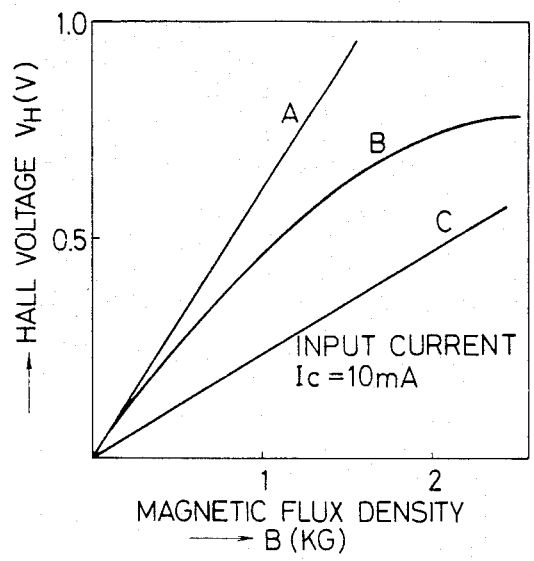
FIG. 4 shows the Hall voltage vs. flux density profile for the device of the present invention as compared with the two conventional devices.
Figure 5:
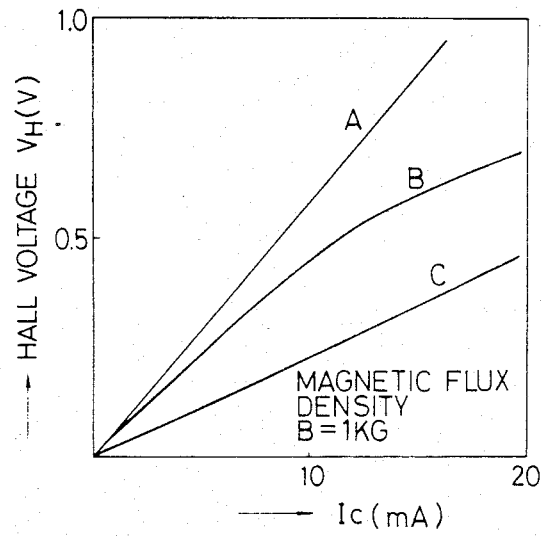
FIG. 5 shows the Hall voltage vs. bias current profile for the device of the present invention as compared with the two conventional devices.

FIG. 4 shows the Hall voltage vs. flux density profile for the Hall device according to the present invention wherein x=0.15, as compared with the two conventional Hall devices, one using a ferrite substrate as shown in FIG. 2 and the other using a silicon substrate, both with an InSb film of a thickness of 1.4μ. FIG. 5 shows the Hall voltage vs. bias current profile for the Hall device according to the present invention (x=0.15), as compared with the two conventional Hall devices. In each figure, the symbol A represents the Hall device of the present invention, B denotes the device using the ferrite substrate, and C refers to the device using the silicon substrate.

As is apparent from FIG. 4, the Hall device using the In$_{1-x}$Ga$_x$Sb film according to the present invention had appreciably higher sensitivity and linearity than the conventional devices. In particular, the relation between the Hall voltage and magnetic flux density remained satisfactorily linear until the flux density reached 10 kGauss. FIG. 5 also demonstrates the good performance of the device of the present invention. In particular, the sensitivity was about two and a half times that of the device using the Si substrate, and the linearity of the relation between the Hall voltage and the bias current was much better than that of the device using the ferrite substrate.

Figure 6:
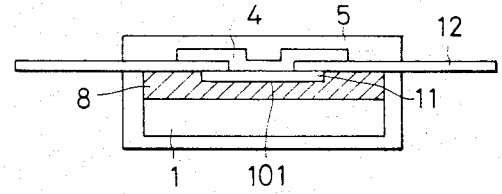
FIG. 6 shows another embodiment of the magnetoelectric transducer of the present invention.

Another embodiment of the present invention is shown in FIG. 6, wherein the crystal of In$_{1-x}$Ga$_x$Sb (0<x<0.4) is fixed within a recess 101 about 3μ deep formed in the center of the thin semiconductor (SiO$_2$) oxide film 8 by etching. Then, the surface of the crystal is polished or etched to provide a thin In$_{1-x}$Ga$_x$Sb film 2 nearly equal in thickness to the depth of the recess. An electrode 12 is connected to the thin film 11, with one end fixed by means of low-melting point solder or electrically conductive paste and the other end extending as a terminal. An Al$_2$O$_3$ protective film 4 is deposited on the bare surface of the thin semiconductor 2 not covered by the electrode 12, and thereafter, the entire assembly is packaged within a molding resin 5.

The In$_{1-x}$Ga$_x$Sb (indium-gallium-antimony) material of which the thin film 11 is made has a much greater Hall constant and mobility than conventionally used InSb, InAs and GaAs. In the embodiment of FIG. 6, the crystal, which has a Hall constant of 800 cm$^3$/coul. and a mobility of 25,000 cm$^2$/V. sec. is polished or etched to form a thin film having a thickness of about 3μ. The film within the recess made substantially in the central portion of the oxide film 8 provides a remarkable increase in the sensitivity of the device. The crystal of In$_{1-x}$Ga$_x$Sb has a negligible deviation from the desired composition as compared with a thin polycrystalline film formed on the oxide film by vapor deposition or a like method. Therefore, it is fairly easy to produce a crystal which has the stoichiometrical composition of a III-V group compound semiconductor, and the crystal thus obtained has fewer crystal defects than a polycrystalline thin film and achieves a higher mobility for a given value of x. If x increases, namely, as In$_{1-x}$Ga$_x$Sb departs from InSb and becomes closer to GaSb, the mobility decreases, but still, for the reason stated above, it is higher than the mobility of the thin polycrystalline film. Furthermore, the thin film made from the single crystal of In$_{1-x}$Ga$_x$Sb has an appreciably increased Hall constant. Therefore, the magnetoelectric transducer using this thin film has a high product sensitivity, as well as a high sensitivity at the maximum flux density.

The description of the embodiments of FIGS. 3 and 6 primarily concerns itself with the use of a Si substrate, but it should be understood that the concept of the present invention can also be implemented with other substrates either magnetic or non-magnetic, such as ceramics (e.g. alumina), ferrite, glass, and iron and aluminum plates. In FIG. 6, the thin semiconductor film is fixed within a recess made in the oxide (e.g. SiO$_2$ or Al$_2$O$_3$) film on the substrate, but if the substrate is made of an electrically insulating material such as glass or ceramics, the thin semiconductor film may be directly fixed onto the substrate without the oxide film. It is also to be noted that the term "magnetoelectric transducer" as used herein includes both a Hall device and a magnetoresistor.

As described in the foregoing, the present invention provides a high-performance magnetoelectric transducer with greatly improved product sensitivity and sensitivity at maximum flux density due to the use of a thin semiconductor film fixed to a substrate either directly or through an oxide film, and which is made of a crystal of In$_{1-x}$Ga$_x$Sb having a high mobility and a constant.

What is claimed is:

1. A magnetoelectric transducer, comprising; a substrate, an oxide film disposed on said substrate, and a thin film of crystalline semiconductor In$_{1-x}$Ga$_x$Sb ($0<x\leq 0.2$) formed on at least a part of said oxide.

2. A device as claimed in claim 1, wherein said substrate comprises an Si substrate.

3. A device as claimed in claim 1, wherein said substrate comprises non-magnetic substrate.

4. A device as claimed in claim 1, wherein said substrate comprises a ceramic substrate.

5. A device as claimed in claim 1, wherein said substrate comprises a magnetic substrate.

6. A device as claimed in claim 1, wherein said substrate is formed of ferrite.

7. A device as claimed in claim 1, wherein said oxide film comprises a metal oxide film.

8. A device as claimed in claim 1, wherein said oxide film comprises a semiconductor oxide film.

9. A device as claimed in claim 1, further comprising an electrode layer in contact with a portion of said crystalline semiconductor, and a protective layer formed over at least exposed surfaces of said crystalline semiconductor.

10. A device as claimed in claim 9, further including a collector positioned generally centrally of said protective layer.

* * * * *